(12) United States Patent
Crippa et al.

(10) Patent No.: US 11,340,262 B2
(45) Date of Patent: May 24, 2022

(54) CONTACT PROBE FOR A TESTING HEAD FOR TESTING HIGH-FREQUENCY DEVICES

(71) Applicant: Technoprobe S.p.A., Cernusco Lombardone (IT)

(72) Inventors: Roberto Crippa, Cernusco Lombardone (IT); Flavio Maggioni, Cernusco Lombardone (IT); Andrea Calaon, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 9 days.

(21) Appl. No.: 16/870,794

(22) Filed: May 8, 2020

(65) Prior Publication Data

US 2020/0271692 A1 Aug. 27, 2020

Related U.S. Application Data

(63) Continuation-in-part of application No. PCT/EP2018/080243, filed on Nov. 6, 2018.

(30) Foreign Application Priority Data

Nov. 9, 2017 (IT) .......................... 102017000128116

(51) Int. Cl.
   *G01R 1/073* (2006.01)
(52) U.S. Cl.
   CPC ..... *G01R 1/07357* (2013.01); *G01R 1/07371* (2013.01)

(58) Field of Classification Search
   CPC ............ G01R 1/07357; G01R 1/07371; G01R 1/06772; G01R 1/06755; G01R 1/06738; G01R 1/06744; G01R 31/2886
   See application file for complete search history.

(56) References Cited

U.S. PATENT DOCUMENTS

2019/0137544 A1* 5/2019 Hsieh ................. G01R 1/06733

FOREIGN PATENT DOCUMENTS

| EP | 1 923 708 A1 | 5/2008 |
| EP | 2 060 921 A1 | 5/2009 |
| KR | 10-1421051 B1 | 7/2014 |
| WO | 2016/156002 A1 | 10/2016 |

* cited by examiner

*Primary Examiner* — Lee E Rodak
(74) *Attorney, Agent, or Firm* — Seed Intellectual Property Law Group LLP

(57) ABSTRACT

A contact probe for a testing head of an apparatus for testing electronic devices comprises a body extending along a longitudinal axis between a first end portion and a second end portion, the second end portion being adapted to contact pads of a device under test. Suitably, the contact probe comprises a first section, which extends along the longitudinal axis from the first end portion and is made of an electrically non-conductive material, and a second section, which extends along the longitudinal axis from the second end portion up to the first section, the second section being electrically conductive and extending over a distance less than 1000 µm.

15 Claims, 9 Drawing Sheets

CONTACT PROBE FOR A TESTING HEAD FOR TESTING HIGH-FREQUENCY DEVICES

BACKGROUND

Technical Field

The present disclosure relates to a contact probe for a testing head of an apparatus for testing electronic devices integrated on a semiconductor wafer, and the following description is made with reference to this application field with the only purpose of simplifying the exposition thereof.

Description of the Related Art

As it is well known, a probe head or testing head is a device adapted to electrically connect a plurality of contact pads of a microstructure, in particular an electronic device that is integrated on a wafer, with corresponding channels of a testing machine that performs the functionality testing, in particular electric, thereof, or the test, generically.

The test, which is performed on integrated devices, is particularly useful in detecting and isolating defective circuits as early as in the production phase. Normally probe heads are therefore used for electric tests of devices integrated on wafers before cutting and assembling them inside a chip containment package.

Generally, a probe head comprises a high number of contact elements or contact probes formed by special alloys with good electrical and mechanical properties and provided with at least one contact portion for a corresponding plurality of contact pads of a device under test.

A so-called "vertical probe head" comprises a plurality of contact probes retained by at least one pair of plates or guides that are substantially plate-shaped and parallel to each other. Said guides are provided with suitable holes and are arranged at a certain distance from each other in order to leave a free space or air gap for the movement and possible deformation of the contact probes. In particular, the pair of guides comprises an upper guide and a lower guide, both provided with respective guide holes within which the contact probes axially slide, usually made of wires of special alloys with good electric and mechanical properties.

The good connection between the contact probes and the contact pads of the device under test is ensured by pressing the probe head on the device itself, the contact probes, which are movable within the guide holes made in the upper and lower guides, undergoing, during said pressing contact, a bending inside the air gap between the two guides and a sliding inside such guide holes.

Furthermore, the bending of the contact probes in the air gap can be helped through an appropriate configuration of the probes themselves or their guides, as schematically illustrated in FIG. 1, where, for the sake of simplicity of illustration, a unique contact probe of the plurality of contact probes usually comprised in a probe head has been shown, the probe head illustrated being of the so-called shifted-plate type. In particular, FIG. 1 schematically shows a probe head 1 comprising at least one upper plate or guide 2 and a lower plate or guide 3, having respective upper guide holes 2*a* and lower guide holes 3*a* within which at least one contact probe 4 slides.

The contact probe 4 has at least one end portion or contact tip 4*a*, the terms end or tip indicating here and in the following an end portion, which is not necessarily pointed. In particular, the contact tip 4*a* abuts onto a contact pad 5*a* of a device under test 5, performing the mechanical and electric contact between said device and a testing apparatus (not represented), which said probe head forms an end element of.

In some cases, the contact probes are fixedly fastened to the head itself at the upper guide: such probe heads are referred to as "blocked probe heads". Alternatively, probe heads are used with unblocked probes, i.e. probes not fixedly fastened, but held interfaced to a board through a micro-contact board: such probe heads are referred to as "unblocked probe heads". The micro-contact board is usually called "space transformer" since, besides contacting the probes, it also allows spatially redistributing the contact pads formed thereon with respect to the contact pads present on the device under test, in particular relaxing the distance constraints between the centers of the pads themselves.

In this case, as illustrated in FIG. 1, the contact probe 4 has a further contact tip 4*b*, in practice indicated as contact head, towards a plurality of contact pads 6*a* of said space transformer 6. Good electric contact between probes and space transformer is ensured analogously to the contact with the device under test by pressing the contact heads 4*b* of the contact probes 4 onto the contact pads 6*a* of the space transformer 6.

The upper guide 2 and the lower guide 3 are suitably spaced by an air gap 7 that allows the deformation of the contact probes 4 and ensures the contact of tip and contact head of the contact probes 4 with the contact pads of the device under test 5 and of the space transformer 6, respectively.

The correct working of a probe head is known to be basically linked to two parameters: the vertical movement, or overtravel, of the contact probes and the horizontal movement, or scrub, of the contact tips of such contact probes. These features should be evaluated and calibrated in the manufacturing step of a probe head, since the good electric connection between probes and the device under test should always be ensured.

It is likewise important to ensure that the pressing contact of the contact tips onto the contact pads of the device under test is not so high as to cause the probe or the pad itself to break.

This problem is strongly felt in the case of the so-called short probes, namely probes with limited body height, in particular with dimensions less than 5000 μm. Probes of this type are for instance used for high-frequency applications, the reduced length of the probes limiting the connected self-inductance phenomenon. In particular, the term "probes for high-frequency applications" indicates probes that are capable of carrying signals whose frequencies are greater than 1 GHz.

There is now a desire to produce probe heads capable of carrying signals at ever higher frequencies up to the radiofrequencies, with a consequent drastic reduction in length of the contact probes, so as to enable these signals to be carried without adding noise, for instance due to the above-mentioned self-inductance phenomenon.

However, in this case, the reduced length of the body of the probes dramatically increases the stiffness of the probe itself, which implies an increase in the force applied by the respective contact tip onto the contact pads of a device under test, which can lead to the breakage of said pads, with irreparable damage to the device under test, which is to be avoided. Even more dangerously, the increase in the stiffness of the contact probe due to the reduction in the length of its body also increases the risk of breakage of the probes themselves.

Therefore, it is desirable to provide a testing head whose contact probes have structural and functional features so as to allow using them in high-frequency applications, at the same time maintaining a sufficient elasticity and therefore reducing the risk of breakage thereof and of the contact pads of a device under test which they are in contact with, without adding noise to the signals carried by the same, overcoming the limitations and drawbacks which still affect the known solutions.

BRIEF SUMMARY

The present disclosure provides a contact probe wherein only one section thereof, comprising a contact tip in contact with a device under test, is electrically conductive, this conductive section having a length less than 1000 µm, preferably less than 500 µm, and being adapted to contact conductive tracks or portions of a guide of a testing head in which the probe is housed, the rest of the probe being electrically non-conductive and comprising a contact head abutting onto a support plate, this contact head thus realizing just a mechanical contact with said support plate.

More in particular, an exemplary contact probe for a testing head of an apparatus for testing electronic devices comprises a body extending along a longitudinal axis between a first end portion and a second end portion, the second end portion being adapted to contact pads of a device under test, wherein the contact probe comprises a first section, which extends along the longitudinal axis from the first end portion and is made of an electrically non-conductive material, and a second section, which extends along the longitudinal axis from the second end portion up to the first section, this second section being electrically conductive and extending over a distance less than 1000 µm.

More particularly, the disclosure comprises the following additional characteristics, taken individually or in combination if required.

According to an aspect of the present disclosure, the contact probe may have an overall length comprised between 3 mm and 10 mm, this length being measured along the longitudinal axis.

According to another aspect of the present disclosure, the second section may be entirely made of a conductive material and may be connected to the non-conductive first section, or it may be made of the same electrically non-conductive material of the first section and it may be coated by a conductive coating material.

Alternatively, the first section may be made of a semiconductor material and the second section may be made of the same semiconductor material of the first section, the semiconductor material at the second section being doped so that the second section is electrically conductive.

The present disclosure also refers to testing head for an apparatus for testing electronic devices, comprising at least one guide provided with a plurality of guide holes for housing a respective plurality of contact probes, wherein those contact probes are made as above indicated, this at least one guide comprising electrical connection means adapted to be electrically contacted by the second section of the contact probes.

According to an aspect of the present disclosure, the at least one guide may be a lower guide arranged at the second section of the contact probes.

According to another aspect of the present disclosure, the electrical connection means can comprise conductive tracks extending from the guide holes. In particular, the conductive tracks may be arranged on a face of the at least one guide and/or may be embedded in the at least one guide.

Furthermore, the conductive tracks may be connected to respective pads made on the at least one guide.

According to an aspect of the present disclosure, at least two contact probes may be electrically connected by at least one of those conductive tracks and/or by a circuit component.

According to another aspect of the present disclosure, the electrical connection means may comprise at least one conductive portion which includes and electrically connects the holes of at least one group of the guide holes to each other, this group housing a corresponding group of the contact probes.

According to yet another aspect of the present disclosure, the at least one conductive portion can be arranged on a face of the at least one guide or can be embedded in the at least one guide.

Furthermore, the conductive portion may be in the form of a plurality of conductive layers, each of those conductive layers including and electrically connecting the holes of a respective group of the guide holes to each other, each of those conductive layers being adapted to contact the second section of a corresponding group of the contact probes, wherein contact probes of each corresponding group are adapted to carry a same type of signal.

According to an aspect of the present disclosure, at least a portion of the inner surface of the guide holes can be covered by a conductive portion connected to the electrical connection means, the second section of those contact probes being adapted to electrically contact the conductive portion of those guide holes.

Finally, the testing head of the present disclosure may comprise further contact probes adapted to carry a signal from a device under test directly to a support plate associated with the testing head, these further contact probes being adapted to carry power signals and/or ground signals and/or low frequency signals between the device under test and the support plate.

The features and advantages of the contact probe and of the testing head according to the disclosure will become apparent from the following description of an embodiment thereof, given by way of non-limiting example with reference to the accompanying drawings.

DETAILED DESCRIPTION

Figure 1:
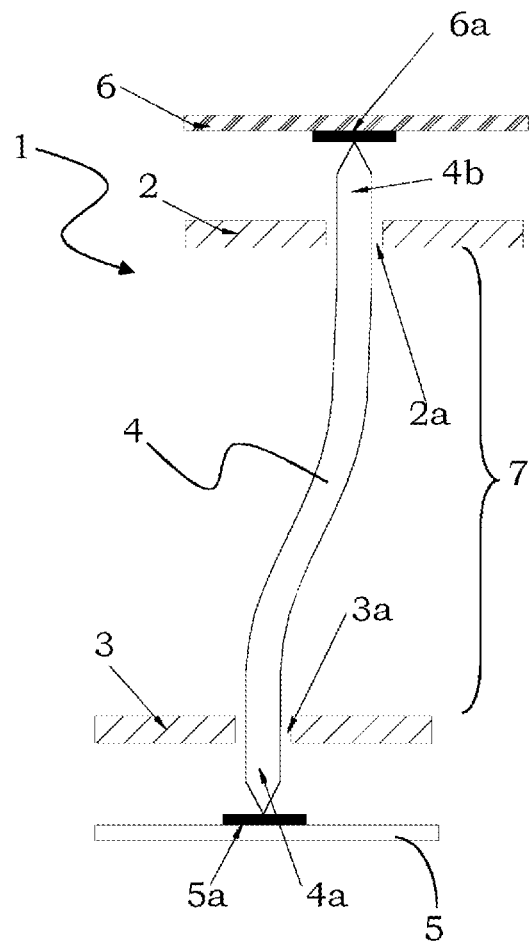
FIG. 1 schematically shows a contact probe for a testing head according to the prior art.
Figure 2:
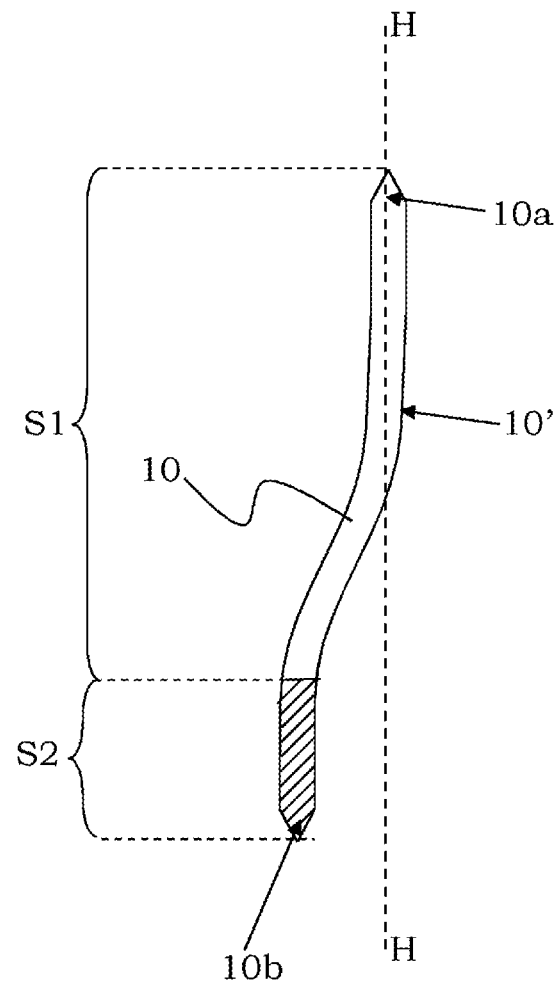
FIG. 2 schematically shows a contact probe according to the present disclosure.

With reference to those Figures, and in particular to FIG. 2, a contact probe for a testing head of an apparatus for testing electronic devices integrated on semiconductor wafer is globally and schematically indicated with the reference number 10.

It is worth noting that the Figures represent schematic views and are not drawn to scale, but instead they are drawn so as to emphasize the important features of the disclosure. Moreover, in the Figures, the different elements are depicted in a schematic manner, their shape varying depending on the application desired. It is also noted that in the Figures the same reference numbers refer to elements that are identical in shape or function. Finally, particular features described in relation to an embodiment illustrated in a Figure are also applicable to the other embodiments illustrated in the other Figures.

As it will be illustrated in greater detail in the following, the contact probe 10 is adapted to be housed in a testing head for testing high-frequency electronic devices.

The contact probe 10 comprises a body 10' which extends along a longitudinal axis H-H between a first end portion or contact head 10a and a second end portion or contact tip 10b, the terms contact head and contact tip indicating here and in the following portions which are not necessarily pointed. The first end portion 10a is adapted to abut onto a support plate, whereas the second end portion 10b is adapted to contact pads of a device under test.

Advantageously according to the present disclosure, the contact probe 10 is divided into two sections that follow each other along the longitudinal axis H-H, these sections having different electrical conductivity properties.

In particular, the contact probe 10 comprises a first section S1, which extends along the longitudinal axis H-H from the first end portion 10a and is made of an electrically non-conductive material, and a second section S2, which extends along the longitudinal axis H-H from the second end portion 10b up to the first section S1, the second section S2 being instead electrically conductive.

In other words, the first end portion 10a of the contact probe 10 is only included in the first section S1, which does not include the second end portion 10b, whereas the latter is only included in the second section S2, which thus does not include the first end portion 10a.

The contact probe 10 has an overall length comprised between 3 and 10 mm, this length indicating herein a dimension measured along the longitudinal axis H-H. Suitably, the second section S2 extends from the second end portion 10b over a distance less than 1000 µm, preferably less than 500 µm, so that the contact probe 10, and the testing head housing it, is particularly suitable for testing high-frequency devices. In fact, the second end portion 10b of the contact probe 10 carries out an electrical and mechanical contact with the contact pads of the device under test, whereas the first end portion 10a is adapted to only carry out a mechanical contact with the support plate. In this way, the first section S1 is not adapted to carry signals, which are only carried in the second section S2, having length less than 1000 µm and thus much less with respect to the overall length of the contact probe 10.

In this way, the first section S1, having length much greater than that of the second section S2, ensures a good bending capacity for the contact probe 10 during its contact with the contact pads of the device under test, thus avoiding breakage of the same and/or of the contact pads of the device. Suitably, for the first section S1, materials adapted to maximize said damping effect during the contact with the device under test are used.

According to an embodiment of the present disclosure, the second section S2 is entirely made of a conductive material and is suitably connected to the non-conductive first section S1, for instance by means of a glue, an adhesive layer or a locally weldable metal layer (for instance weldable by laser welding), or in any other suitable way.

Alternatively, the second section S2 of the contact probe 10 is made of the same electrically non-conductive material of the first section S1 and is then coated by a conductive coating material. In this way, the contact probe 10 thus comprises a core made of a non-conductive material and only the second section S2 is coated by the conductive coating material.

It is noted that the material which the first non-conductive section S1 is made of is selected from a semiconductor material, preferably silicon, or in general a non-metal insulating material (such as for instance a reinforced polymeric material), whereas the conductive material which the second conductive section S2 is made of is selected from metal materials, preferably copper or palladium alloys, or doped semiconductors.

Consequently, in the present description, the term "electrically non-conductive material" indicates both insulating materials and semiconductors.

According to a further embodiment of the present disclosure, the entire contact probe 10 is made of a semiconductor material and only one portion thereof, corresponding to the second section S2, is doped in order to form said conductive section S2. In other words, the first section S1 is made of a semiconductor material and the second section S2 is made of the same semiconductor material, which is doped with conductive material so that said second portion S2 is electrically conductive. In this embodiment, it is also possible to cover the second section S2 with a further layer of conductive material in order to increase the contact resistance of the contact probe 10.

In this case, as previously mentioned, the semiconductor material is preferably silicon, whereas the doping material is selected for instance from phosphorus or boron.

Figure 3:
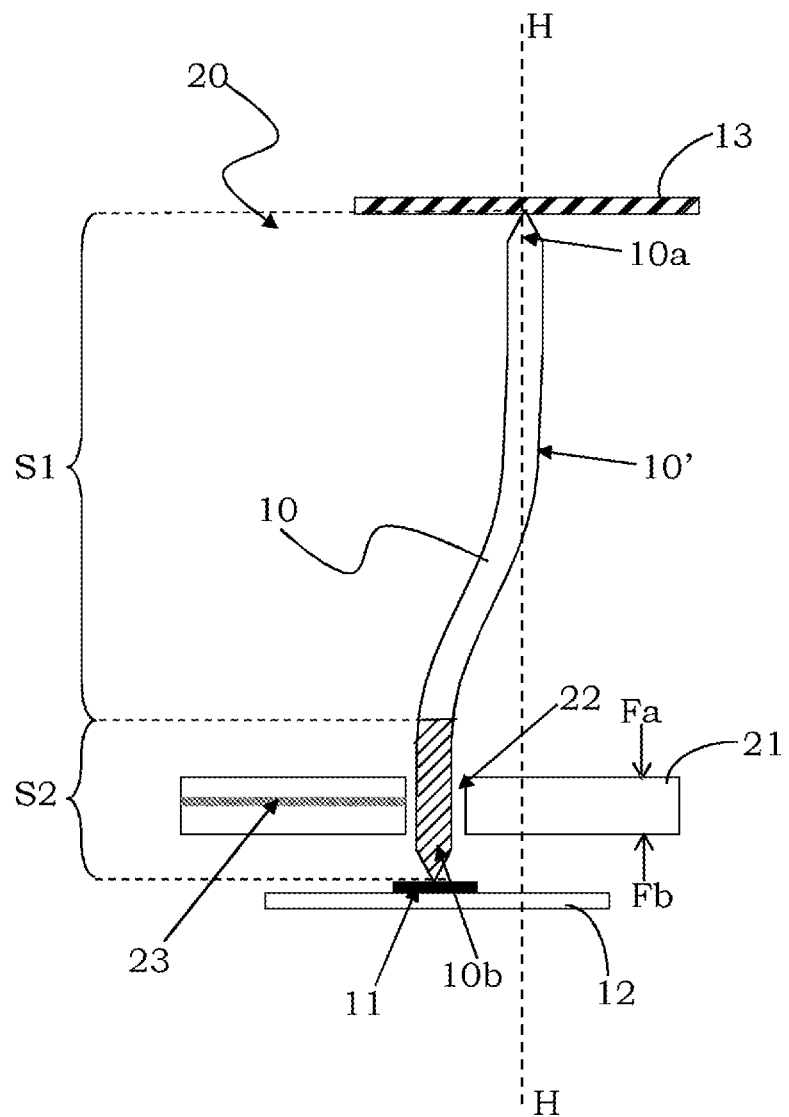
FIG. 3 schematically shows a testing head comprising the contact probe of FIG. 2.

As previously mentioned, a plurality of contact probes 10 of the above described type is housed in a testing head for testing electronic devices integrated on a semiconductor wafer, this testing head being indicated herein with the reference number 20, as schematically illustrated in FIG. 3.

It is pointed out that, for the sake of simplicity of illustration, the testing head 20 is represented in the Figures as comprising a limited number of contact probes 10, even if it may obviously comprise any number of contact probes according to the needs and/or circumstances, the Figures being provided just by way of non-limiting example of the present disclosure.

The second end portion 10b of each contact probe 10 is adapted to abut onto contact pads 11 of a device under test integrated on a semiconductor wafer 12, whereas the first end portion 10a is adapted to abut onto a support plate 13 associated with the testing head 20, wherein this support plate may be for instance a printed-circuit board (PCB).

The testing head 20 comprises at least one guide 21 provided with a plurality of guide holes 22 adapted to house a corresponding plurality of contact probes 10.

Advantageously according to the present disclosure, the guide 21 is a lower guide arranged at the second section S2 of each contact probe 10, so that the inner walls of the guide holes 22 of the guide 21 are capable of contacting this second section S2, in particular through electrical connectors comprised in the guide 21.

In this regard, still referring to FIG. 3, the electrical connectors of the guide 21 comprise suitable conductive tracks 23 which extend from the guide holes 22 and are adapted to extract and carry the signal carried by the contact probes 10, in particular by the second section S2, these conductive tracks 23 being adapted to be electrically contacted by the second section S2.

Consequently, the guide 21 provides for the routing of signals (for example towards the PCB associated with the testing head 20) by means of the conductive tracks 23 which extend therein, and therefore it also performs the function usually performed by the space transformers associated with the known testing heads.

In the embodiment of FIG. 3, the conductive tracks 23 are adapted to directly contact the second section S2 of the contact probe 10, namely the contact between the section S2 of the contact probe 10 and the conductive track 23 is a sliding contact ensured by the thickness of the conductive track 23 itself, which is embedded in the guide 21 and emerges at the guide hole 22.

Figure 4:
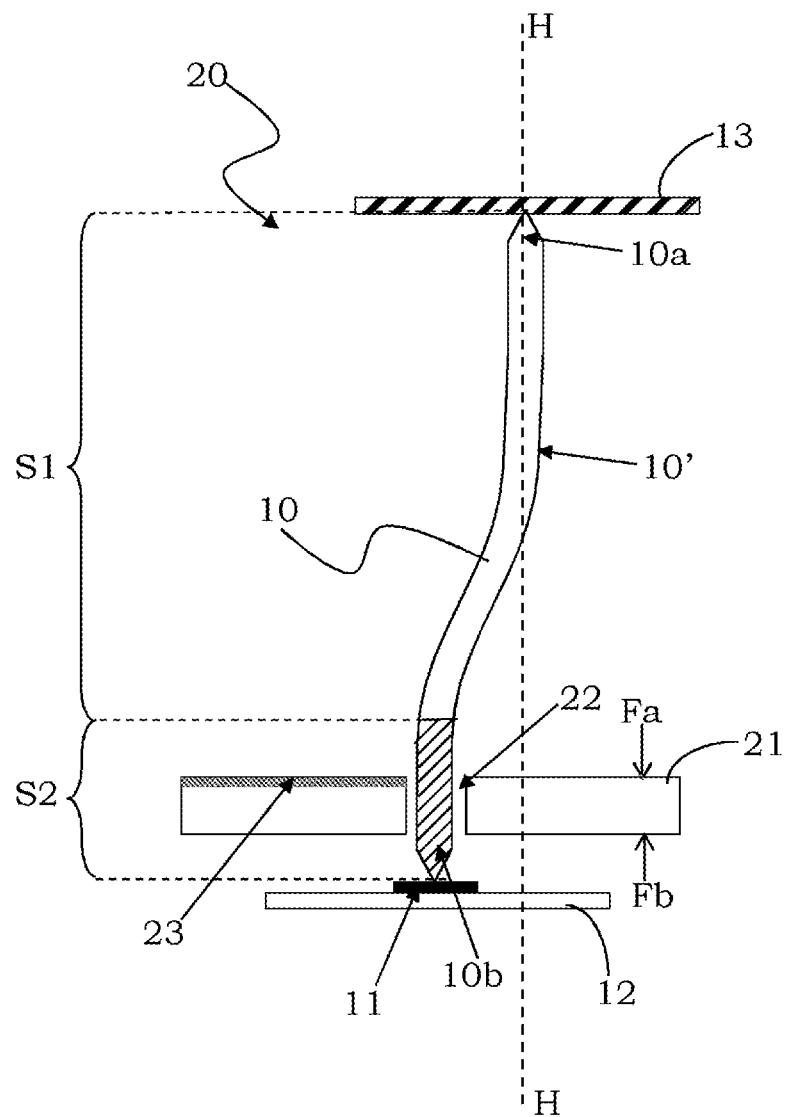
FIGS. 4 and 5 schematically show a testing head according to alternative embodiments of the present disclosure.

As illustrated in FIG. 4, the conductive track 23 may also be a surface conductive track, namely it may be arranged on a face of the guide 21 (the face Fa in the example of the Figure), this conductive track 23 emerging in any case always at the guide hole 22.

It is evident that, although FIG. 4 shows a surface conductive track 23 arranged on face Fa of the guide 21 (i.e. on an upper face thereof according to the local reference system of the Figures), the conductive track 23 could also be arranged on face Fb, opposite to the face Fa (i.e. on a lower face thereof according to the local reference system of the Figures), of the guide 21, as well as on any other face thereof.

Figure 5:
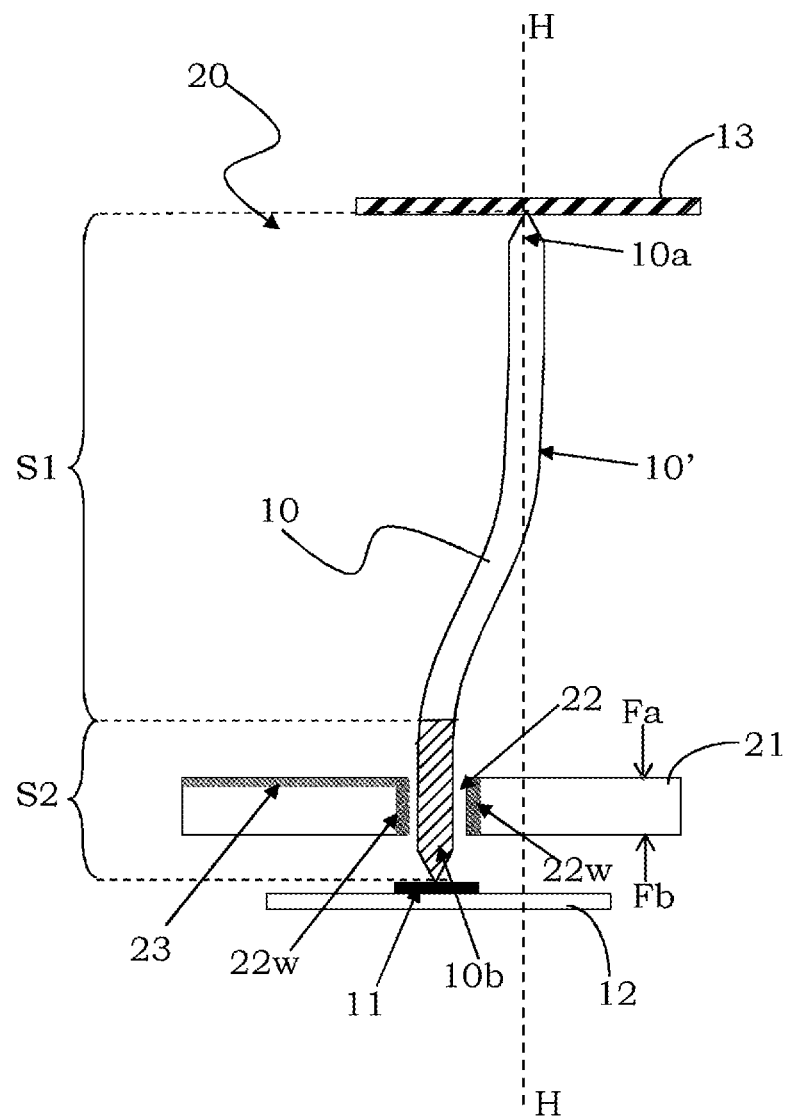

According to a preferred embodiment of the present disclosure, illustrated in FIG. 5, at least one portion of the inner surface of the guide holes 22 is covered by a conductive portion 22w. Still more preferably, the inner surface of the guide holes 22 is entirely covered by the conductive portion 22w. In this way, the conductive section S2 is capable of contacting the conductive portion 22w of the guide holes 22 through a sliding contact, so that the signal carried by the contact probe 10, in particular by the section S2, can be extracted at the guide holes 22 through the conductive tracks 23, which are connected to the conductive portions 22w, in particular they extend therefrom.

Figure 6:
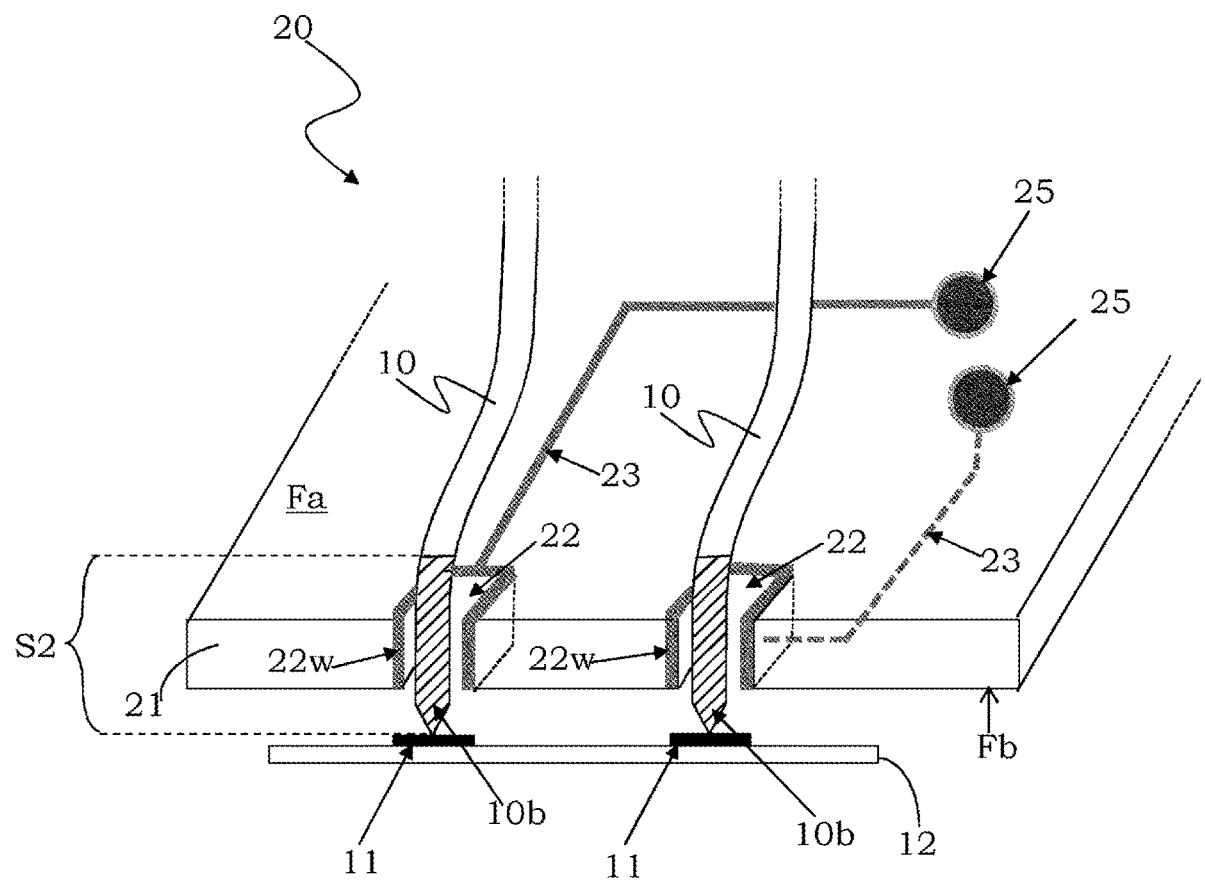
FIG. 6 schematically shows a perspective sectional view of a testing head according to the present disclosure, wherein a guide thereof comprises surface conductive tracks embedded therein.

Furthermore, it is pointed out that the guide 21 may comprise both surface conductive tracks and conductive tracks embedded therein, as schematically shown in FIG. 6.

In general, when several conductive tracks 23 extend both on face Fa and/or on face Fb of the guide 21 and inside it, these conductive tracks 23 are arranged on different levels from the surface of the guide 21. The number of levels of the guide 21 where the conductive tracks 23 are arranged may vary according to the needs and/or circumstances, in particular according to the number of signals to be carried and therefore according to the complexity of the routing pattern to be performed in the guide 21. For instance, it is possible to provide for a configuration in which a first level comprises tracks adapted to carry a first type of signal and a second level comprises tracks adapted to carry a second type of signal.

As previously mentioned, the contact between the contact probe 10, in particular the second section S2 thereof, and the walls of the guide holes 22, preferably provided with the conductive portion 22w, is a sliding contact that ensures the electric connection between the second section S2 and the conductive portion 22w (or possibly directly with the conductive track 23).

Suitably, still referring to FIG. 6, the conductive tracks 23 (in particular an end thereof opposite to the end at the guide holes 22) are connected to respective contact pads 25, which are arranged on a face of the guide 21 (the face Fa in the example of FIG. 6). In this way, it is possible to extract a respective signal from the testing head 20 and carry it for instance to a PCB connected to the testing head 20.

Furthermore, in the case of conductive tracks 23 embedded in the guide 21, the end portions of these conductive tracks 23 emerge on a face thereof, so as to allow the electrical connection between said conductive tracks 23 and the respective contact pads 25.

Figure 7:
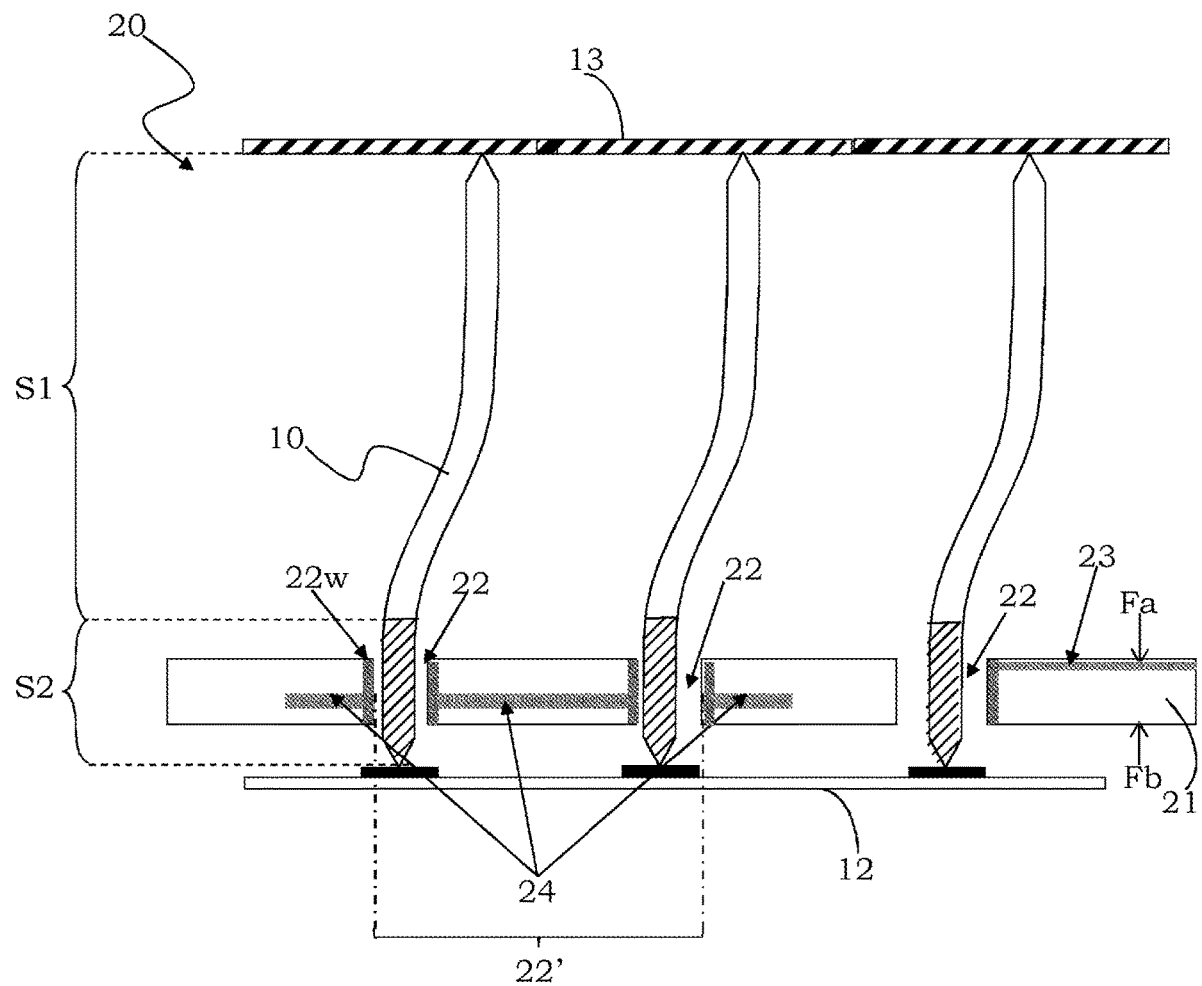
FIGS. 7 and 8 schematically show a testing head according to embodiments of the present disclosure, wherein a guide thereof comprises conductive portions.

Referring now to FIG. 7, according to an embodiment of the present disclosure, the testing head 20 comprises a conductive portion 24 acting as electrical connection means which includes and electrically connects a group 22' of the guide holes 22 housing a corresponding group of contact probes 10, wherein this conductive portion 24 can be used in addition or alternatively to the conductive tracks 23.

In this way, at least two contact probes 10 can be electrically connected by at least one conductive track 23 or by the conductive portion 24 of the guide 21, this conductive portion 24 covering an area of the guide 21 that includes the group 22' of guide holes housing the contact probes that are to be short-circuited.

In case only two contact probes 10 need to be short-circuited, it is preferable to use one conductive track 23 as electrical connection means between them, whereas in case more than two contact probes 10 need to be short-circuited, it is preferable to use a conductive portion 24 as electrical connection means between them, this conductive portion 24 forming a common conductive plane for said contact probes 10.

The possibility to electrically connect different contact probes, in particular the possibility to electrically connect the second section S2 of different contact probes, is particularly advantageous in case two or more contact pads of the device under test need to be short-circuited, since it is possible to implement a configuration of the loop-back type, considerably shortening the path of the signals which do not pass through the entire contact probe from and towards the test apparatus but they stop at the conductive track or at the common conductive plane, with consequent advantages in terms of frequency performance of the testing head 20 as a whole.

Still referring to FIG. 7, the conductive portion 24 is embedded in the guide 21, forming a conductive plane inside the guide 21, this Figure illustrating, as a non-limiting example of the present disclosure, a testing head 20 comprising an embedded conductive portion 24 and a surface conductive track 23.

Alternatively, according to an embodiment not illustrated in the Figures, the conductive portion 24 may be arranged on a surface portion of the guide 21, in particular on its face Fa or on its opposite face Fb, or it may be arranged on both faces Fb and Fb.

Figure 8:
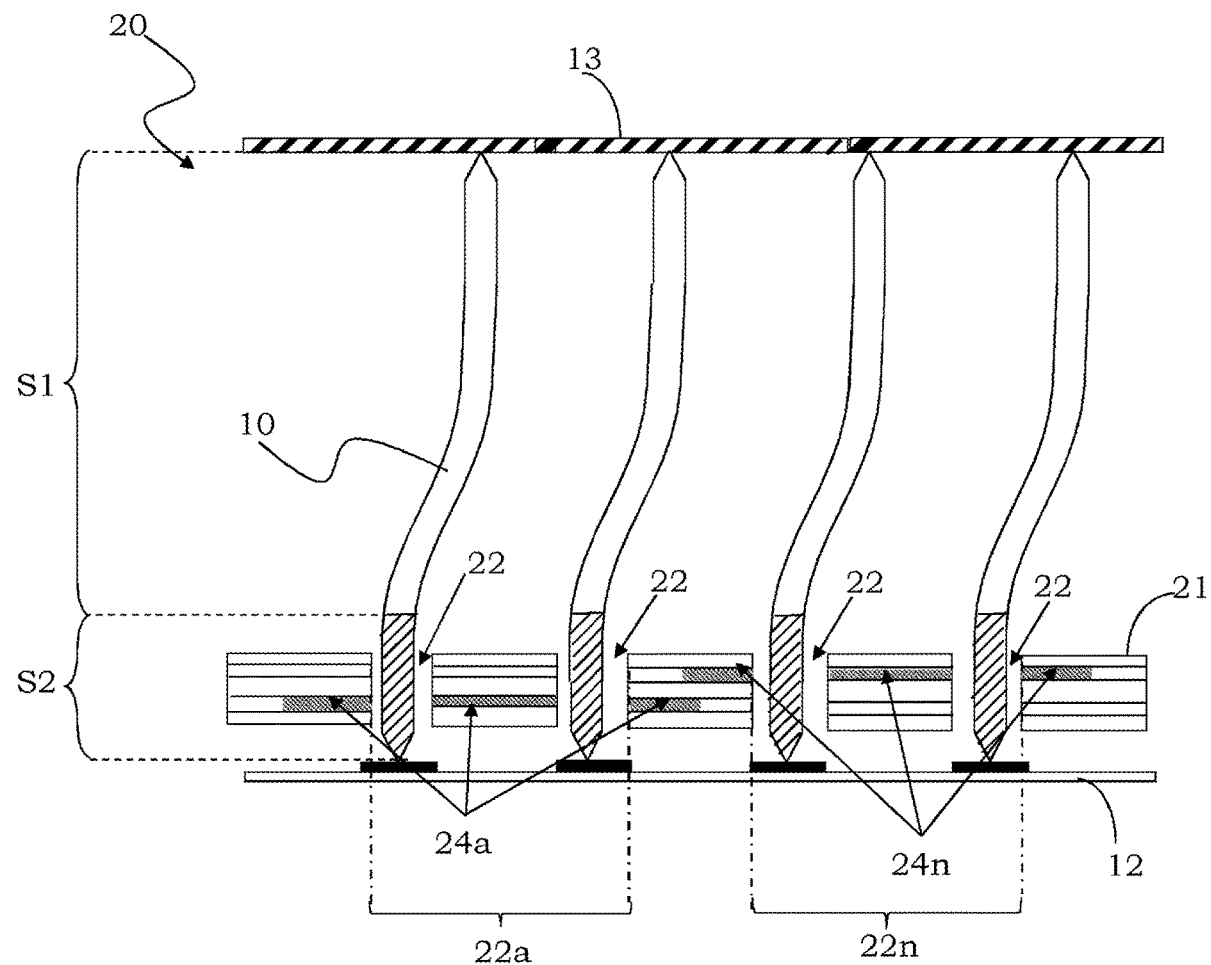

Furthermore, according to an embodiment shown in FIG. 8, the conductive portion 24 is in the form of a plurality of overlapped conductive layers 24a-24n, each of which includes and electrically connects a corresponding group 22a-22n of the guide holes 22. In this way, each conductive layer 24a-24n is adapted to contact a corresponding group of the contact probes 10 according to the present disclosure, in particular their second section S2, wherein contact probes of each corresponding group are adapted to carry a same type of signal.

In this way, the guide 21 is a multilayer comprising a plurality of non-conductive layers, preferably a ceramic multilayer, the conductive layers 24a-24n being arranged on said non-conductive layers, which electrically insulate a conductive layer from the following one.

In particular, each of the conductive layers 24a-24n is arranged on a face of a corresponding non-conductive layer of the guide 21 and has a lower area than an area of said face.

Alternatively, each of the conductive layers 24a-24n covers a face of a corresponding non-conductive layer except for areas where guide holes housing contact probes that must not be short-circuited are formed.

Obviously, the conductive layers 24a-24n may also comprise surface layers arranged on at least one of the exposed faces Fa and Fb of the guide 21, or they may only be embedded in the guide 21, as illustrated in FIG. 8.

In case the contact probes to be short-circuited are close (for instance alternated) to the contact probes that must not be short-circuited, the conductive portion 24 (or alternatively each conductive layer 24a-24n) is locally interrupted by non-conductive zones, so as not to electrically connect contact probes intended to carry different signals. Consequently, the non-conductive zones locally prevent the electrical connection between adjacent contact probes intended to carry different signals.

For instance, in case of a plurality of conductive layers 24a-24n, the non-conductive zones of a specific conductive layer are formed at the guide holes housing contact elements which are not desired to be short-circuited by this specific conductive layer, whereas this specific layer covers at least partially the walls of the guide holes housing contact elements which are desired to be short-circuited by it.

Furthermore, according to an embodiment not illustrated in the Figures, the metalizations of two guide holes, or even of two conductive portions 24, in contact with the second section S2 of the probes 10, can be electrically connected by means of a circuit component, such as for instance a filtering capacitor, so as to optimize the loop-back technique, since this filtering capacitor is positioned as near as possible to the contact tips of the probes.

Obviously, the circuit component may also be any other circuit component adapted to specific needs, such as for instance an inductor or a resistor or even a relay.

It is further noted that the testing head 20 may also comprise more than one guide in addition to the lower guide 21, for instance an intermediate guide and/or an upper guide (not illustrated in the Figures), according to solutions known in the field.

Figure 9:
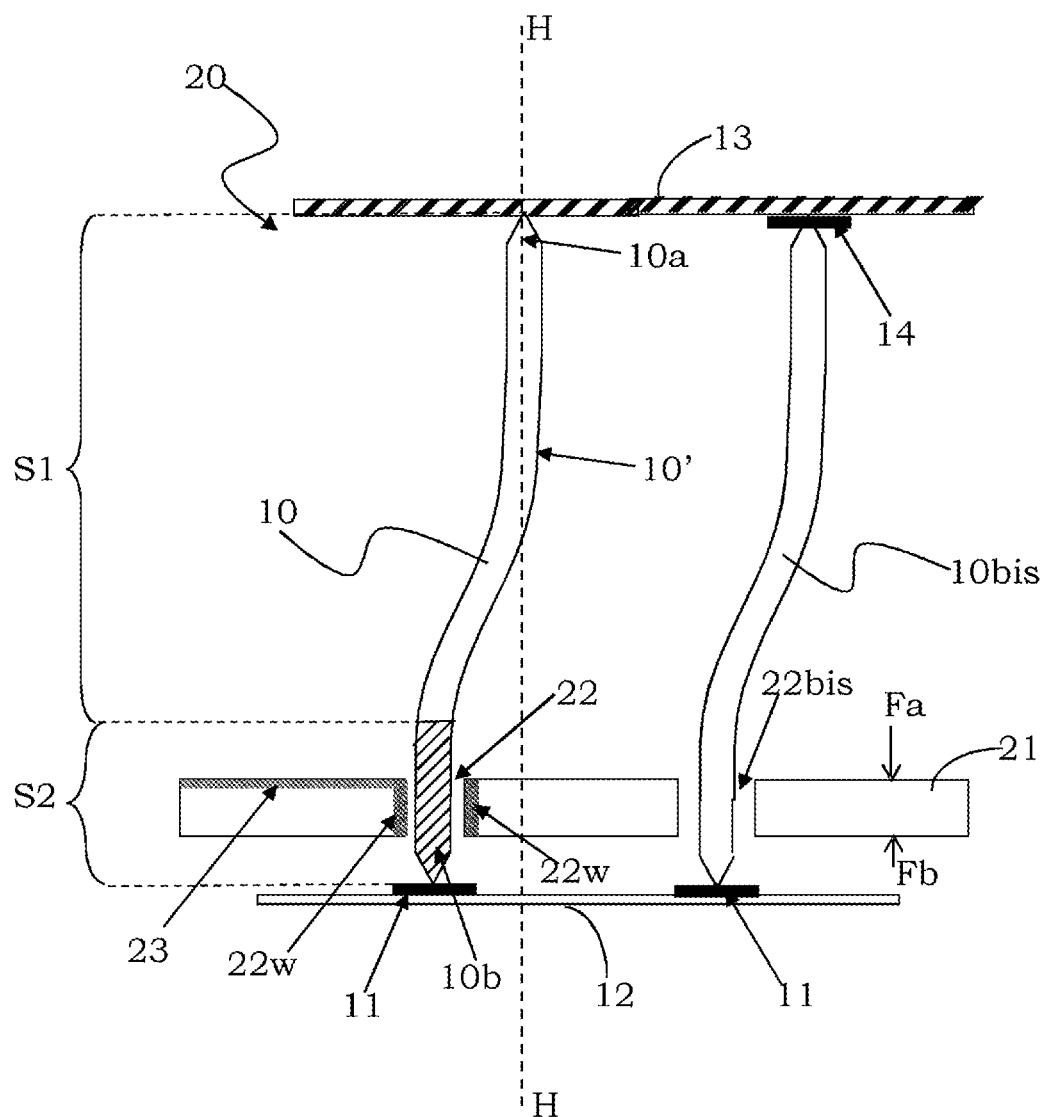
FIG. 9 schematically shows a testing head according to an embodiment of the present disclosure.

The probe head 20, in addition to the contact probes 10 according to the present disclosure, may also comprise contact probes 10*bis* made according to the prior art (i.e. entirely made of a conductive material), these contact probes 10*bis* being housed in corresponding guide holes 22*bis*, as illustrated in FIG. 9. Consequently, the testing head 20 generally comprises a first group of contact probes 10 according to the present disclosure and a second group of contact probes 10*bis* according to the prior art.

While the contact probes 10 are preferably adapted to carry high-frequency signals thanks to the reduced length of their second conductive section S2, the contact probes 10*bis* are generally adapted to carry ground or power signals or even low-frequency input/output signals, i.e. signals that can be carried by probes of the known type without suffering self-inductance problems, in any case greatly simplifying the routing of signals by the guide 21.

In this case, the contact probes 10*bis* are thus adapted to carry the signal from the device under test directly to the support plate 13, which comprises suitable conductive pads 14 against which the contact heads of theses probes 10*bis* are adapted to abut.

Finally, it is pointed out that what has been stated above regarding the contact probes 10 according to the present disclosure is also valid for the contact probes 10*bis* of the known type, namely it is possible to provide for conductive portions which short-circuit these contact probes 10*bis* of the known type.

In conclusion, the present disclosure provides a contact probe wherein only one section thereof, comprising a contact tip in contact with a device under test, is electrically conductive, this conductive section having a length less than 1000 µm, preferably less than 500 µm, and being adapted to contact conductive tracks or portions of a guide of a testing head in which the probe is housed, the rest of the probe being electrically non-conductive and comprising a contact head abutting onto a support plate, this contact head thus realizing just a mechanical contact with said support plate. Advantageously according to the present disclosure, the illustrated testing head is particularly performing in high-frequency applications, thanks to the reduced dimensions of the conductive section of the contact probes, this section being intended to carry the signals and having a length less than 1000 µm and thus much less than that of the contact probes according to the prior art.

A distinctive feature of the present disclosure is thus the possibility of carrying the signal only through the conductive section towards conductive tracks made on the lower guide of the probe head, the rest of the probe being non-conductive and only acting as a mechanical support that ensures a contact with a support plate (i.e. a PCB or any other support) and the desired bending of the contact probe, at the same time avoiding that such remaining non-conductive portion of the probe acts as an antenna or stub, since the signal is not carried therein.

In other words, the conductive section of the contact probe according to the present disclosure acts as a very short probe and thus eliminates the disadvantageous self-inductance problem of the probes of the known type, this contact probe perfectly working from the mechanical point of view thanks to the presence of the second non-conductive portion, thus solving the drawbacks of the prior art.

Therefore, the proposed solution allows effectively testing high-frequency devices, obviating the stiffness of the short probes, drastically reducing the possibility of breakage of the contact probes themselves and at the same time ensuring a suitable reduction in the pressure exerted by them, avoiding any breakage of the contact pads of the devices under test onto which the contact probes abut.

It is also possible to obtain a testing head with improved performance in terms of signal filtering, thanks to the presence of suitable circuit components, in particular capacitors that connect two contact probes to each other.

Finally, the possibility of adopting a hybrid configuration, wherein further contact probes are adapted to carry specific signals, greatly simplifies the routing of signals by the guide, which according to the present disclosure acts as a space transformer. This is mainly useful in case of several signals to be carried through the testing head. For instance, by means of these further contact probes it is possible to carry power signals and/or ground signals, namely signals which do not need particularly short contact probes, whereas high-frequency signals, requiring short probes in order to avoid self-inductance problems, are carried in the conductive section of the probes according to the present disclosure.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A contact probe for a testing head of an apparatus for testing electronic devices, the contact probe comprising a body extending along a longitudinal axis between a first end portion and a second end portion, the second end portion being configured to electrically contact pads of a device under test,
    wherein the contact probe comprises a first section, which extends along the longitudinal axis from the first end portion and is made of an electrically non-conductive material, and a second section, which extends along the longitudinal axis from the second end portion to the first section, the second section being electrically conductive and extending over a distance less than 1000 µm,
    wherein said first and second sections follow each other along the longitudinal axis of the contact probe so that the first end portion is only included in the first section and the second end portion is only included in the second section,
    wherein the first end portion is configured to perform only a mechanical contact,
    wherein the first section has a length greater than the second section and is configured to provide a damping effect during contact with the device under test, and
    wherein the first end portion and the second end portion are opposite terminal end portions of the contact probe.

2. The contact probe according to claim 1, wherein the contact probe has an overall length comprised between 3 mm and 10 mm, said length being measured along the longitudinal axis of the contact probe.

3. The contact probe according to claim 1, wherein the second section is entirely made of a conductive material and is connected to the non-conductive first section, or wherein the second section is made of the same electrically non-conductive material of the first section and is coated by a conductive coating material.

4. The contact probe according to claim 1, wherein the first section is made of a semiconductor material and the second section is made of the same semiconductor material of the first section, the semiconductor material at the second section being doped so that the second section is electrically conductive.

5. A testing head for an apparatus for testing electronic devices, comprising
    at least one guide provided with a plurality of guide holes;
    a plurality of contact probes housed in the guide holes, respectively, each of said contact probes including a body extending along a longitudinal axis between a first end portion and a second end portion, the second end portion being configured to electrically contact a respective pad of a device under test,
    wherein the contact probe comprises a first section, which extends along the longitudinal axis from the first end portion and is made of an electrically non-conductive material, and a second section, which extends along the longitudinal axis from the second end portion to the first section, the second section being electrically conductive and extending over a distance less than 1000 µm,
    wherein said first and second sections follow each other along the longitudinal axis of the contact probe so that the first end portion is only included in the first section and the second end portion is only included in the second section,
    wherein the first end portion is configured to perform only a mechanical contact, the at least one guide comprising electrical connectors configured to be electrically contacted by the second sections of the contact probes.

6. The testing head according to claim 5, wherein the at least one guide is a lower guide arranged at the second section of the contact probes.

7. The testing head according to claim 5, wherein the electrical connectors comprise conductive tracks extending from the guide holes.

8. The testing head according to claim 7, wherein the conductive tracks are arranged on a face of the at least one guide and/or are embedded in the at least one guide.

9. The testing head according to claim 7, comprising conductive pads made on the at least one guide and connected to the conductive tracks.

10. The testing head according to claim 7, wherein at least two of the plurality of contact probes are electrically connected to each other by at least one of the conductive tracks and/or by a circuit component.

11. The testing head according to claim 5, wherein the electrical connectors comprise at least one conductive portion which includes and electrically connects the guide holes of at least one group of the guide holes to each other, said group housing a corresponding group of the contact probes.

12. The testing head according to claim 11, wherein the at least one conductive portion is arranged on a face of the at least one guide or is embedded in the at least one guide.

13. The testing head according to claim 11, wherein the at least one group of guide holes includes plural groups of guide holes, the plurality of contact probes includes plural groups of contact probes, and the at least one conductive portion includes a plurality of conductive layers, each of the conductive layers electrically connecting the holes of a respective group of the groups of guide holes to each other, each of said conductive layers being configured to contact the second sections of a corresponding group of said groups of contact probes, wherein contact probes of each corresponding group are configured to carry a same type of signal.

14. The testing head according to claim 5, wherein the electrical connectors includes conductive portions respectively covering at least a portion of respective inner surfaces of the guide holes, the second sections of the contact probes being configured to electrically contact the conductive portions.

15. The testing head according to claim 5, comprising a support plate and further contact probes configured to carry a signal from the device under test directly to the support plate of the testing head, said further contact probes being configured to carry power signals and/or ground signals and/or low frequency signals between the device under test and the support plate.

* * * * *